United States Patent
Sontag et al.

(10) Patent No.: US 8,075,334 B2
(45) Date of Patent: Dec. 13, 2011

(54) DEVICE FOR CONNECTING AN ELECTRONIC HOUSING IN A HOLDER THROUGH AT LEAST TWO TRANSLATION MOVEMENTS

(75) Inventors: Yves Sontag, Bordeaux (FR); Eric Rauscent, Lormont (FR); Ludovic Pennetier, Erce (FR)

(73) Assignee: Thales (FR)

( * ) Notice: Subject to any disclaimer, the term of this patent is extended or adjusted under 35 U.S.C. 154(b) by 49 days.

(21) Appl. No.: 12/443,735

(22) PCT Filed: Oct. 4, 2007

(86) PCT No.: PCT/EP2007/060550
§ 371 (c)(1),
(2), (4) Date: Nov. 10, 2009

(87) PCT Pub. No.: WO2008/040783
PCT Pub. Date: Apr. 10, 2008

(65) Prior Publication Data
US 2010/0055966 A1    Mar. 4, 2010

(30) Foreign Application Priority Data
Oct. 6, 2006  (FR) ..................................... 06 08797

(51) Int. Cl.
*H01R 13/64* (2006.01)
(52) U.S. Cl. ........................................ 439/376; 439/926
(58) Field of Classification Search .................. 439/374, 439/376
See application file for complete search history.

(56) References Cited

U.S. PATENT DOCUMENTS

| | | | |
|---|---|---|---|
| 3,917,372 A * | 11/1975 | Selinko .......................... | 439/298 |
| 4,734,049 A * | 3/1988 | George et al. .................. | 439/259 |
| 4,913,383 A | 4/1990 | Hill et al. | |
| 5,167,520 A * | 12/1992 | Henry et al. ................... | 439/266 |
| 5,203,021 A * | 4/1993 | Repplinger et al. ........ | 455/575.9 |
| 5,252,089 A * | 10/1993 | Hatagishi et al. ............. | 439/310 |
| 5,743,755 A * | 4/1998 | Aoki .............................. | 439/354 |
| 5,803,758 A * | 9/1998 | Kameyama .................... | 439/248 |
| 5,919,058 A * | 7/1999 | Tashiro et al. ................. | 439/374 |
| 5,930,428 A | 7/1999 | Irwin et al. | |
| 5,967,808 A * | 10/1999 | Kubota .......................... | 439/157 |
| 6,093,040 A * | 7/2000 | Kodama et al. ............... | 439/157 |
| 6,126,469 A * | 10/2000 | Yamaguchi .................... | 439/310 |
| 6,217,363 B1 * | 4/2001 | Takata ........................... | 439/342 |
| 6,428,340 B2 * | 8/2002 | Okabe et al. .................. | 439/347 |

(Continued)

FOREIGN PATENT DOCUMENTS
DE    19545273 A1    6/1997
(Continued)

*Primary Examiner* — Neil Abrams
(74) *Attorney, Agent, or Firm* — Lowe Hauptman Ham & Berner, LLP

(57) ABSTRACT

An electronic module is designed to be slotted into an aircraft instrument panel. The module has: a rear face and a front face that are substantially flat and parallel. Means are provided for attaching the module to the instrument panel. The attachments are situated on the front face of the module. At least one connector-module is attached on the rear face of the electronic module and can be plugged into a socket mounted on the panel as the electronic module is guided into position on the panel. The direction of plugging in the connector-module situated on the rear face is substantially in the plane of the rear face. The support comprises guidance and rotation means making it possible to guide, plug in and insert the module into the instrument panel.

7 Claims, 6 Drawing Sheets

U.S. PATENT DOCUMENTS

| | | |
|---|---|---|
| 6,612,870 B1 | 9/2003 | Rauscent |
| 6,666,413 B2 * | 12/2003 | Nakajima ............... 248/27.1 |
| 6,878,001 B2 * | 4/2005 | Nishide .................. 439/157 |
| 6,948,953 B2 * | 9/2005 | Fukamachi ............. 439/137 |
| 7,294,002 B2 * | 11/2007 | Noro et al. ............. 439/157 |
| 7,364,452 B2 * | 4/2008 | Carver et al. .......... 439/310 |
| 7,429,137 B2 * | 9/2008 | Sontag et al. ............ 385/75 |

FOREIGN PATENT DOCUMENTS

| | | |
|---|---|---|
| DE | 298 17 464 U1 | 12/1998 |
| DE | 29817461 U1 | 12/1998 |
| FR | 2875646 A1 | 3/2006 |
| JP | 06333638 | 2/1994 |
| WO | 2006029975 A2 | 3/2006 |

* cited by examiner

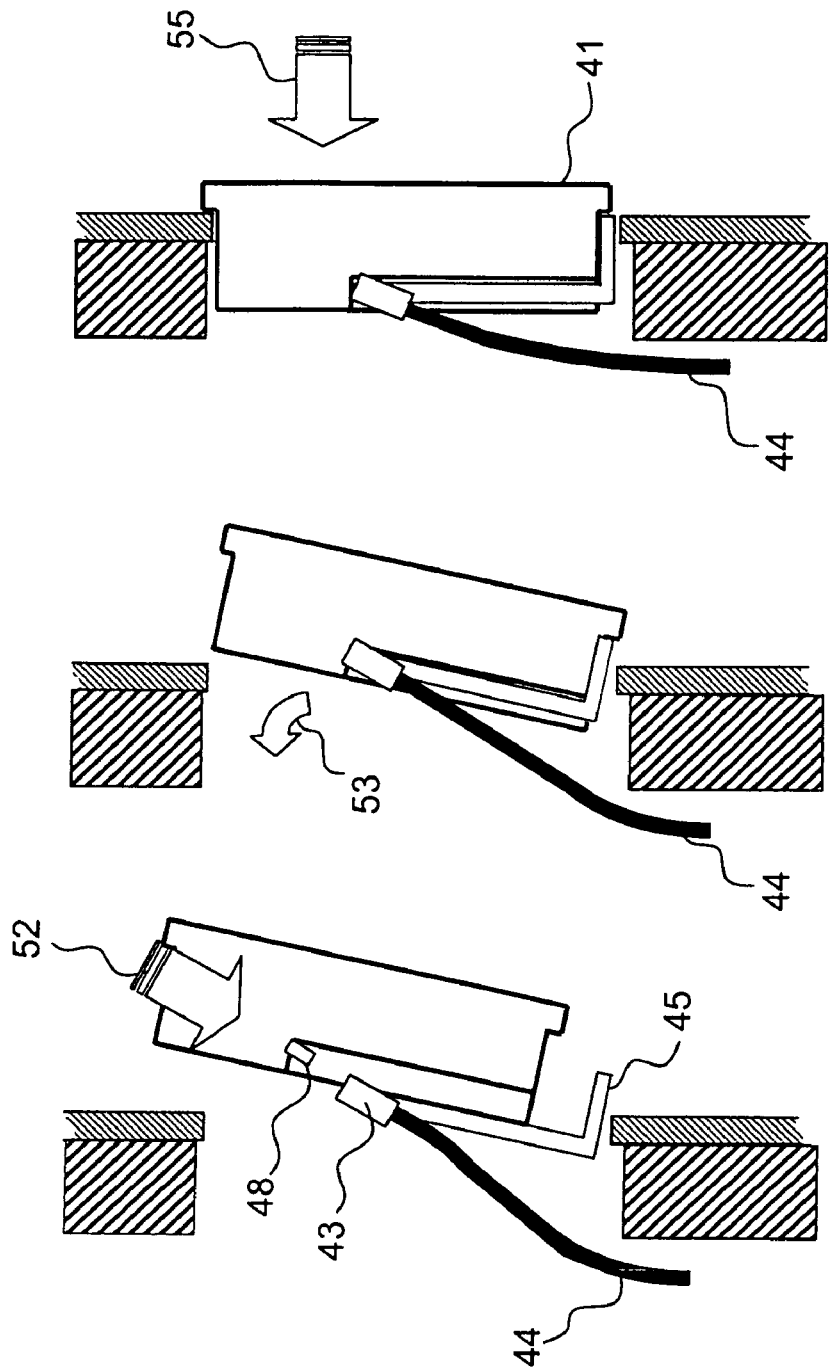

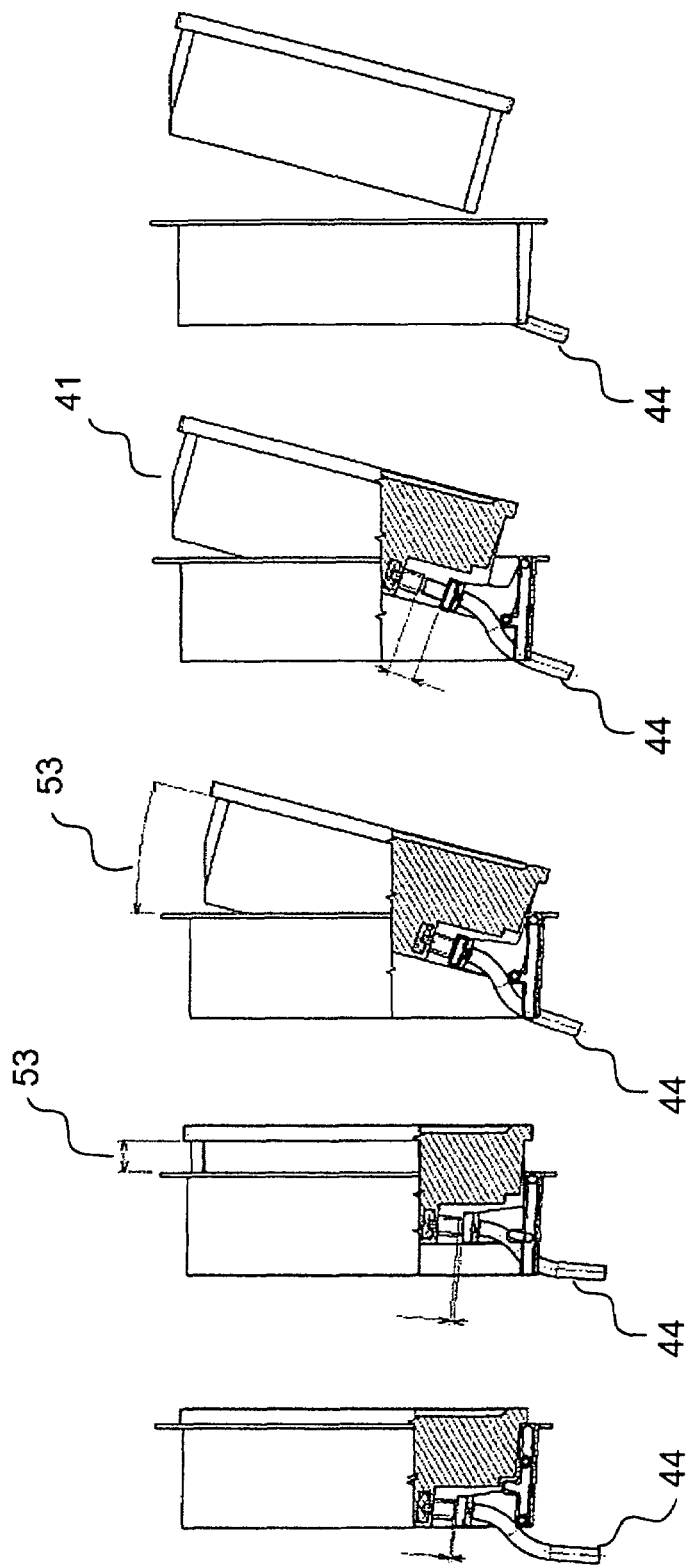

DEVICE FOR CONNECTING AN ELECTRONIC HOUSING IN A HOLDER THROUGH AT LEAST TWO TRANSLATION MOVEMENTS

CROSS-REFERENCE TO RELATED APPLICATIONS

The present Application is based on International Application No. PCT/EP2007/060550, filed on Oct. 4, 2007, which in turn corresponds to French Application No. 06 08797 filed on Oct. 6, 2006, and priority is hereby claimed under 35 USC §119 based on these applications. Each of these applications are hereby incorporated by reference in their entirety into the present application.

FIELD OF THE INVENTION

The present invention relates to the field of devices for the mounting and connection of an electronic module in a support comprising guidance and/or rotation means making it possible to position said module.

It applies notably to the aviation field. In this case, the support is attached to the instrument panel of the flight deck of the aircraft, and the module is usually a flight instrument that may comprise a plug-in device.

More particularly, the device according to the invention may be applied to electronic modules of the display screen type.

BACKGROUND OF THE INVENTION

The space requirement for the connection system, comprising cables and connectors, notably originating from the equipment, of an aircraft instrument panel, is usually considerable.

Wasted space is often a disadvantage in the aviation field where electronic integration, miniaturization, weight and the arrangement of the equipment must be optimized.

In addition, in aircraft, the connection system of the electronic equipment and of the instrument panel is subjected to environmental conditions that are often difficult. The cables and the connectors are reinforced in order to withstand the temperature, vibrating environment and electromagnetic environment stresses. This reinforcement may be produced by means of strands, sheaths or connectors containing reinforced protections. For this reason, the space requirement of these means is greater and their flexibility is reduced.

In particular, in aircraft, the cables and strands situated behind the electronic equipment have a not inconsiderable radius of curvature. The fairly high rigidity of the cables means that they cannot be steered at all or not very easily. Their bulk requires the provision of adequate space.

In particular, electronic equipment of the display screen type mounted in flight decks are the subject of design studies in order to reduce the space occupied behind said screens.

Currently, screens for aircraft usually have two connection methods:

In a first method, they are attached mainly via their front face to the instrument panel and they have a screw or bayonet connector on the rear face. Usually, these connectors are for example connectors complying with the MIL-38999 standard or connectors of the SUB-D type. These connectors are manually connected in advance.

In the second method, they are plugged or racked into a support, for example of the chair, case, rack or airframe type. The support, on the instrument panel, then has a plug-in connector, the element being plugged in blind. Connectors complying with the ARINC600 or ARINC404 standard are an example.

The device according to the invention forms part of the latter method.

FIG. 1 represents a device according to the prior art corresponding to the first method described. The electronic module represents an LCD (liquid crystal display) screen 10. In a first step, the connector 13 is connected to the screen, then, in a second step, the screen is attached via its front face into the base 15. The strand 12 is brought away behind the support forming an arc of a circle.

FIG. 2 represents another device according to the prior art corresponding to the second method described. In the example, the electronic equipment is an LCD screen 10 that can be plugged into a support 16. The support 16 has a dual function. Its first function is to guide the LCD screen 10 when the latter is plugged in, its second function is to support a portion of the forces that hold the screen 10 in the instrument panel.

The connector 11 is attached to the support 16. The direction 14 of connection is perpendicular to the front face of the support and to the front face of the screen. The connection is carried out with the aid of an insertion force applied to the LCD screen 10, usually achieved by a pressure of an operator. The connector 11 of the support is designed to interact with the connector of the LCD screen 10.

These two examples, according to the prior art, represent cases in which the equipment has a connector which comprises internal electric connections and if necessary internal optical fibers. The latter are positioned in the same direction as the axis of the strand, connected to the connector of the support, that is to say perpendicular to the front face of the equipment.

A disadvantage with respect to the optical fibers is that their radius of curvature is large. As a result, the curvature of the strand, behind the support, causes a space requirement in depth.

FIG. 3 represents a detailed view of the connector 22 of the equipment 29 and of the connector of the instrument panel 21. The electronic equipment 29 comprises an optical fiber 25, inside the equipment, directed perpendicularly to the connector; it links the connector 22 to the optoelectronic module 27. The optoelectronic module 27 is attached to a printed circuit 26. Said printed circuit 26 is itself attached to the connector 22 by columns, for example EMI (electromagnetic interface) columns 23. Other electric connections 24 link the printed circuit to the connector 22.

In this example, the optical fiber has a radius of curvature requiring a space 28 in depth inside the equipment when the latter links the optoelectronic module 27 to the connector 22. This space requirement may be a constraint even within the equipment.

When the equipment 29 is inserted into the connector 21, the strand 20 forms an arc of a circle the curvature of which is not inconsiderable. This arc of a circle may constitute an encumbrance of the space situated behind the equipment when the latter is plugged into the instrument panel for example.

The company Rockwell has patented, in U.S. Pat. No. 5,930,428, a device making it possible to integrate the optical/electric converter inside the socket of the connector, so that said connector is rendered active. This device, which is not used or not very much used for very fast connections, for example having a bit rate of several gigabits/s, is difficult to produce and to use with optoelectronic components available off the shelf. This solution therefore requires a development of highly integrated elements. In addition, the function, integrated into the connector, is notably dependent on the wavelength and bit rate. The dependence of the connector on the type of application chosen renders said connector specific or dedicated and is a disadvantage.

Furthermore, the company Thales-Avionics has patented, in the patent whose publication number is WO 2006/029975, a connector socket with electrical and optical contacts. This socket makes it possible to avoid the disadvantages of an active connector, of the type patented by Rockwell. On the other hand, this solution requires the development of a specific component, rendering this solution not very flexible in industrial applications.

SUMMARY OF THE INVENTION

One object of the invention is notably to alleviate the aforementioned disadvantages, notably the space requirement associated with the curvature of the strand of the flight deck.

Advantageously, the electronic module is designed to be slotted into an aircraft instrument panel; said module comprises:
- a rear face and a front face that are substantially flat and parallel;
- means for attaching the module to the instrument panel, the attachments being situated on the front face of said module;
- at least one connector, called a connector-module, that can be plugged in and attached on the rear face of said module.

It is characterized in that the direction of plugging in the connector-module situated on the rear face is substantially in the plane of the rear face.

Advantageously, in a first embodiment, the support may comprise:
- first guidance means, in a first direction of translation, parallel to the direction of plugging in, making it possible to guide the electronic module as claimed in claim 1 and to plug the connector-module into a socket, the socket being a connector secured to the first guidance means;
- said socket arranged on the first guidance means so that the connector-module plugs in the socket in the first direction of translation;
- second guidance means making it possible to insert said module into an instrument panel in a second direction of translation perpendicular to the front face of the module.

Advantageously, in a second embodiment, the support may comprise:
- first guidance means, in a first direction of translation, parallel to the direction of plugging in, making it possible to guide the electronic module as claimed in claim 1 and to plug the connector-module into a socket, the socket being a connector secured to the first guidance means;
- said socket arranged on the first guidance means so that the connector-module plugs in the socket in the first direction of translation;
- means of rotation making it possible to insert said electronic module into said instrument panel following the rotation about the axis perpendicular to the axis of the first direction of translation and contained in the plane of the rear face.

Advantageously, in a third embodiment, the support may comprise:
- first guidance means, in a first direction of translation, parallel to the direction of plugging in, making it possible to guide the electronic module as claimed in claim 1 and to plug the connector-module into a socket, the socket being a connector secured to the first guidance means;
- said socket arranged on the first guidance means so that the connector-module plugs in the socket in the first direction of translation;
- means of rotation making it possible to insert said electronic module into said instrument panel following the rotation about the axis perpendicular to the axis of translation and contained in the plane of the rear face;
- second guidance means making it possible to insert said module into an instrument panel in a second direction of translation, this second direction of translation being perpendicular to the mid plane formed by the instrument panel.

Advantageously, the support may comprise first guidance means that allow a vertical guidance and that the second guidance means allow a horizontal guidance Advantageously, the support may comprise a socket comprising at least one optical fiber.

Advantageously, the direction of plugging in the connector-module may form an angle of 15 degrees or less with the rear face of said module.

Advantageously, the connector-module may comprise at least one optical fiber.

Advantageously, the module may have slides designed to interact with the support.

Advantageously, the electronic module may comprise an LCD screen.

Still other objects and advantages of the present invention will become readily apparent to those skilled in the art from the following detailed description, wherein the preferred embodiments of the invention are shown and described, simply by way of illustration of the best mode contemplated of carrying out the invention. As will be realized, the invention is capable of other and different embodiments, and its several details are capable of modifications in various obvious aspects, all without departing from the invention. Accordingly, the drawings and description thereof are to be regarded as illustrative in nature, and not as restrictive.

BRIEF DESCRIPTION OF THE DRAWINGS

The present invention is illustrated by way of example, and not by limitation, in the figures of the accompanying drawings, wherein elements having the same reference numeral designations represent like elements throughout and wherein:

FIGS. 7a, 7b, 7c represent the three steps of mounting an item of electronic equipment in a support according to another example;

FIGS. 8*a*, 8*b*, 8*c*, 8*d*, 8*e* represent 5 steps for inserting a module into a support according to the principle of FIGS. 7*a*, 7*b* and 7*c*;

DETAILED DESCRIPTION OF THE INVENTION

A solution of the device according to the invention consists in placing the electronic module connector, hereinafter called the connector-module, and the support connector, hereinafter called the socket, in an axis so that the strand does not form a significant curvature. This device is made with the aid of guidance means.

Since the plug-in axis is in the axis of the strand(s) or of the cable(s), the radius of curvature of the latter is negligible or even zero.

Figure 1:
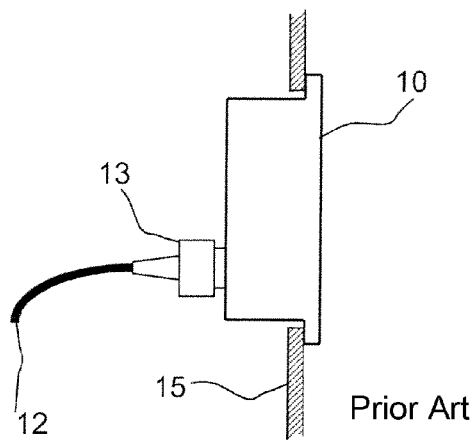
FIG. 1 represents an item of equipment according to the prior art that cannot be plugged into a support.
Figure 2:
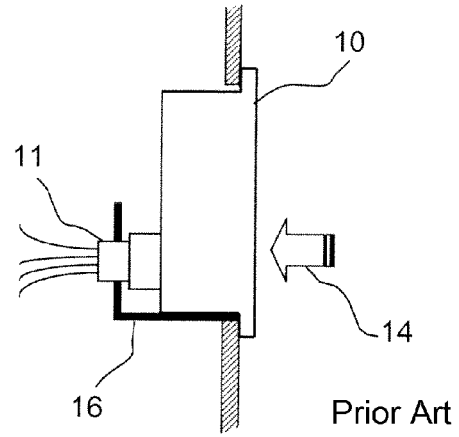
FIG. 2 represents an item of equipment according to the prior art that can be plugged into a support.
Figure 3:
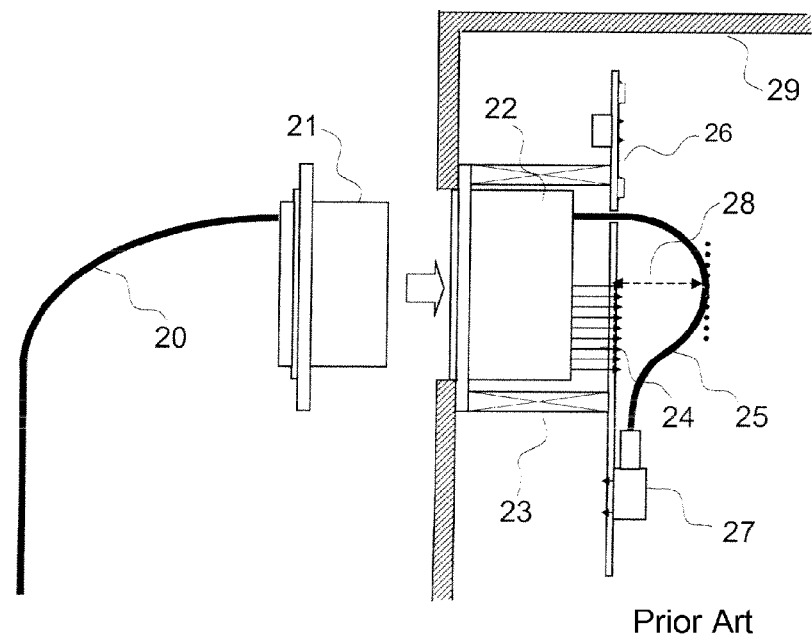
FIG. 3 represents the space requirement of an assembly according to the prior art.
Figure 4:
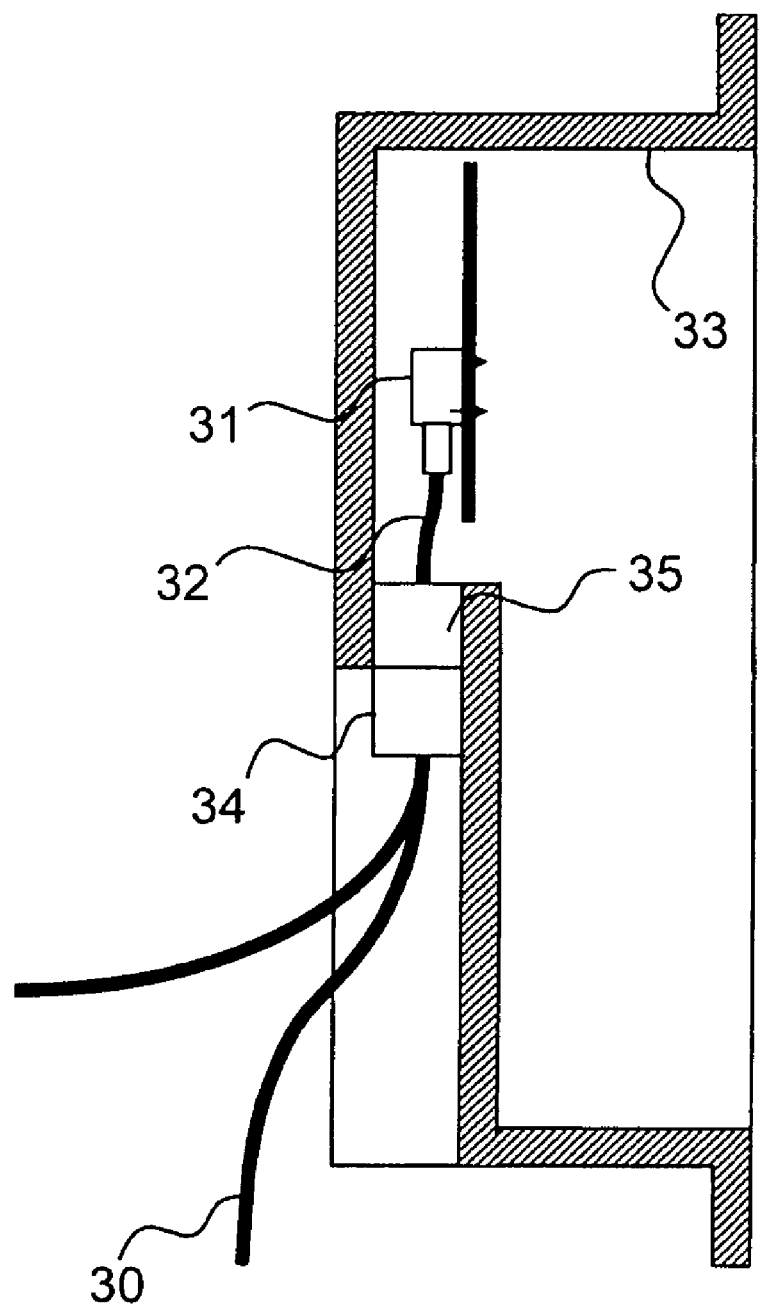
FIG. 4 represents the principle of an item of electronic equipment that can be plugged vertically into a support according to the invention.

FIG. 4 represents a view in section of the device according to a principle of embodiment of the invention. The electronic equipment 33 is connected to the support, which may be an instrument panel for example, by means of a socket 34. The support is not represented in the figure. The socket 34 is a connector designed to interact with the connector-module 35 of the electronic equipment. In the example of FIG. 4, there are two strands one of which comprises an optical fiber 32. The strand 30 contains other connections which may be electrical. This optical fiber is connected, inside the electronic equipment, by means of an optoelectronic module 31, to a printed circuit. Inside the equipment, the arrangement of the components is not penalized by the radius of curvature of the optical fiber 32. Outside the equipment, the strands 30 and 32 are brought away along an axis parallel to the rear face of the equipment. The strands 30 and 32 have no significant radius of curvature at the rear of the equipment.

This type of device has the advantage of being able to save the space, usually occupied by the curvature of the strands of the equipment, situated behind an instrument panel of a flight deck for example. Furthermore, this type of device has the following dual advantage inside the electronic equipment:
of allowing a simpler integration inside the equipment;
of saving space, usually occupied by the curvature of the optical fiber for example, inside said equipment.

An exemplary device, according to the principle of FIG. 4, requires guidance means to make a translation movement of the electronic equipment 33 in a direction parallel to the axis of the strand. However, a single translation is not sufficient. Specifically, the instrument panel comprises several items of electronic equipment. Such a solution would involve allowing a margin on either side of the location provided for the equipment to make this translation.

Figures 5A, 5B:
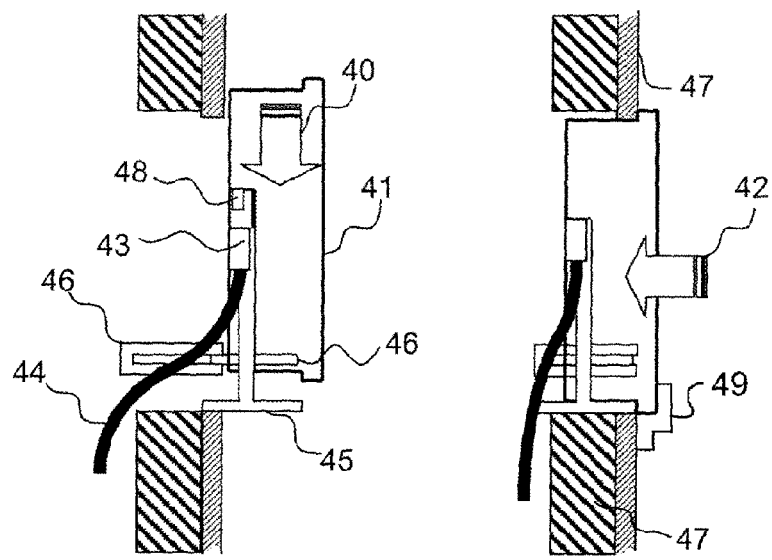
FIGS. 5a, 5b represent the two steps of mounting an item of electronic equipment in a support according to the invention.

A first embodiment of the device according to the invention is shown in FIGS. 5*a* and 5*b*. The device comprises a support and an electronic module 41 being plugged in two steps. In the example, the electronic module 41 may be an LCD screen for example.

In a first step, as indicated in FIG. 5*a*, the latter is plugged into a removable support 45 in a movement of translation 40, in FIG. 5, shown by the downward arrow. The instrument panel of an aircraft flight deck being vertical or virtually vertical, the first translation movement gives preference to the vertical direction which consists in going from top to bottom.

The connection is therefore made in a first translation movement 40. The connector-module of the LCD screen is inserted according to this first movement into the socket 43. The socket 43 is fixed parallel to the support 45 and points from bottom to top in the same axis as the strand 44. The strand 44 is therefore brought away downward without forming a curve or arc of a circle penalizing the space situated behind the instrument panel. The required insertion force is slight for this type of equipment. For items of equipment requiring a high insertion force, a lever or handle device with a gearing effect may be combined with the device according to the invention.

A second phase, as indicated in FIG. 5*b*, called the sliding phase, in the direction 42, makes it possible to insert the LCD screen inside the instrument panel. The support 45 must first be pulled in a forward position, that is to say partially extracted from the front face of the instrument panel. The zone of the instrument panel 47 on either side of the location provided for the LCD screen is reserved for other items of equipment. In order to minimize the space requirement on the surface of the instrument panel, the device comprises a slide 46 which makes it possible to guide the support horizontally into its housing.

The LCD screen is placed between the other items of equipment and occupy the space 47. The LCD screen being inserted in its location, a latching device 49 may be combined with the device according to the invention in order to fix the assembly into the instrument panel. It may preferably be achieved by a spring system or by a fastening of the front face or else by other cam- or handle-based devices for example.

FIGS. 6*a*, 6*b*, 6*c*, 6*d* represent drawings of an embodiment according to the operating principle described with reference to FIGS. 5*a* and 5*b*. These drawings represent the series of steps that make it possible to plug the LCD screen 41 into the support.

Figures 6A, 6B, 6C, 6D:
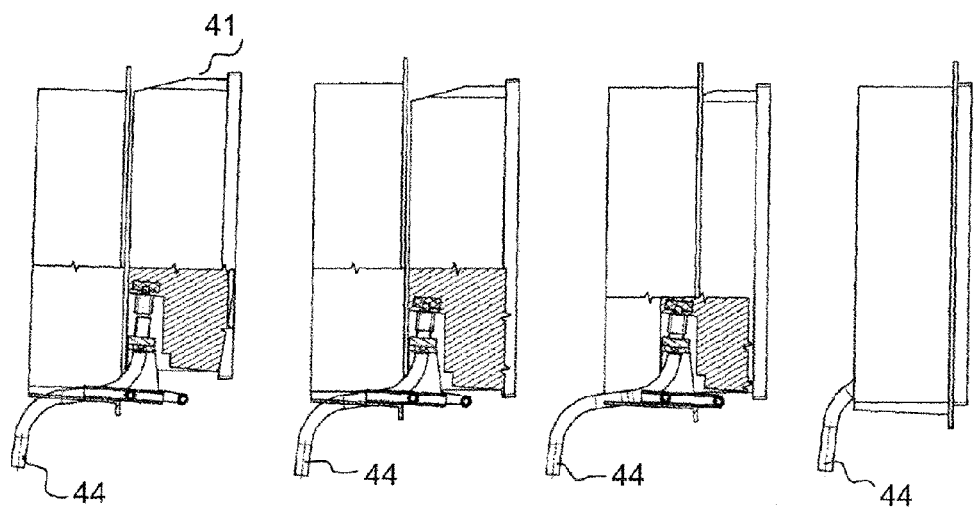
FIGS. 6a, 6b, 6c, 6d represent 4 steps for inserting a module into a support according to the principle of FIGS. 5a and 5b.
Figure 9A:
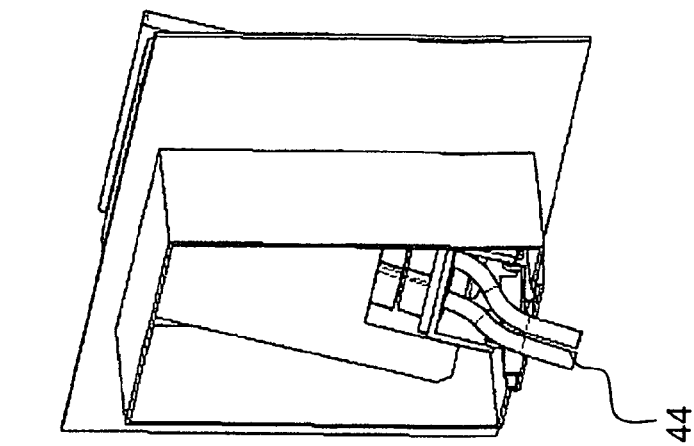
FIGS. 9*a*, 9*b*, 9*c* and 9*d* represent 4 steps for inserting a module into a support in a ¾ view.
Figure 9B:
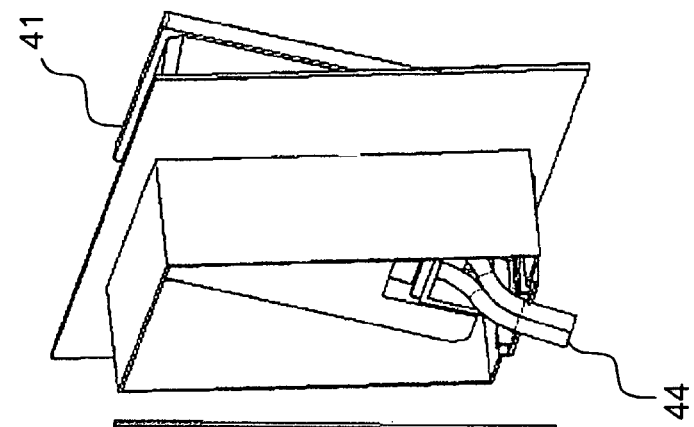
Figure 9C:
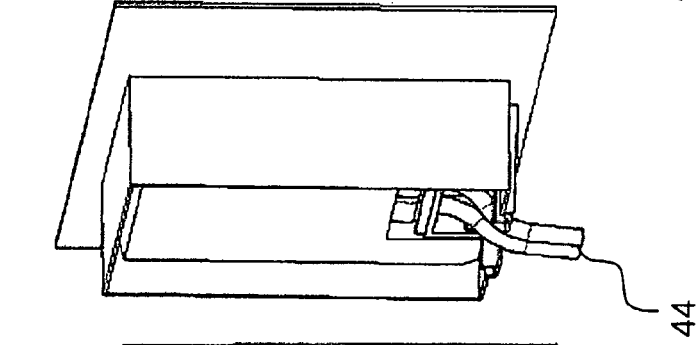
Figure 9D:
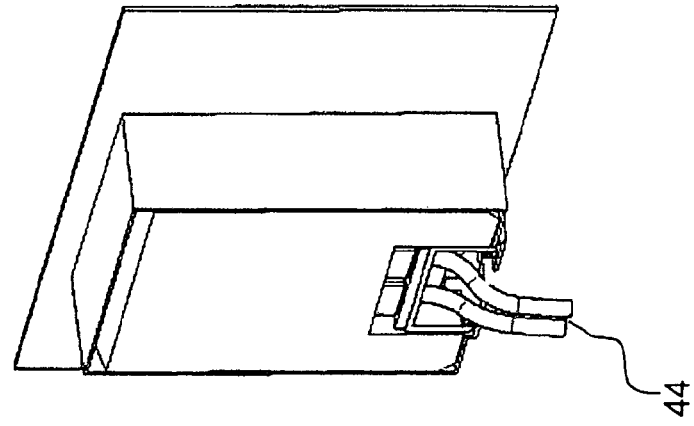

FIG. 6*a* represents the LCD screen not inserted in the support. FIG. 6*b* represents a step of plugging the connector-module into the socket of the support. FIG. 6*c* represents the electronic module positioned after plugging in the connector-module, so as to allow horizontal guidance in order to insert the equipment into its support. Finally, FIG. 6*d* represents the electronic module fully inserted into the support.

In this embodiment, the module, comprising the LCD screen, is preferably beveled on its upper portion, in order to allow sufficient latitude when it is connected to the socket 43. The slide is made by means of a strip with a roller system which makes it possible to insert the equipment into the back of the support. In the example of FIG. 6*a*, the strip is positioned at the base of the support. There are other possibilities of positioning the slide on the electronic equipment and on the support.

The strand 44 is brought away downward causing little or no space requirement behind the support.

A second embodiment is shown in FIGS. 7*a*, 7*b* and 7*c*.

The electronic equipment is an LCD screen 41. The support notably comprises a base and a guide shaft. The connector module 48 of the LCD screen 41 is slightly inclined relative to the rear face of the equipment. It may also be parallel to the rear face of the electronic module in another embodiment. The shaft of the socket of the support is attached to the end of the guide shaft and is slightly inclined relative to said guide shaft. The angle formed between the socket 43 and the guide shaft of the support is equal to the angle formed between the connector-module of the electronic equipment and its rear face. This angle is usually small, that is to say less than 15 degrees so that the force of insertion in the direction of guidance allows the connector-module to be plugged correctly into the socket. Another embodiment, of this example, is to attach the connector-module parallel to the mid plane of the rear face of the module, and to attach the socket parallel to the guide shaft of the support.

FIG. 7*a* represents the LCD screen positioned along the guide shaft of the support 45; it is not plugged in. FIG. 7*b* shows the LCD screen in the plugged-in position, that is to say that the connector-module of the LCD screen is plugged into the socket of the support. FIG. 7c shows the screen in the inserted position in the support after the latter has been rotated.

This embodiment, described in FIGS. 7a, 7b, 7c, requires the LCD screen to be connected in three successive steps:

a first step consists in inserting the LCD screen 41 in a translational movement 52 directed from top to bottom in the example and forming a slight angle 53 with the vertical. This translation is guided by a support 45 the largest position of which, vertical in the example, guides the translation of the equipment into the support. The connector-module 48 is plugged into the socket 43.

A second step consists in pivoting the device comprising the equipment connected to the removable support, through an angle 53, making it possible to bring the assembly, comprising the equipment and the support, into the plane of the instrument panel;

A final step consists in making a translation movement 55 of the equipment connected to the removable support into the space provided for this purpose in the instrument panel. This translation is carried out by means of a slide for example.

FIGS. 8a, 8b, 8c and 8d represent a view in section, by means of several drawings of the assembly comprising the LCD screen and a box comprising the support. The succession of movements used to insert the equipment 41 into the support is broken down into various steps.

FIG. 8a represents the LCD screen and the box comprising the support. FIG. 8b represents the LCD screen positioned on the guide shaft of the support. FIG. 8c represents the plugging-in of the connector-module into the socket of the support. FIG. 8b represents the module plugged into the support after the latter has been rotated. The assembly is then positioned for insertion into the box along a guide shaft of the support. FIG. 8e represents the LCD screen inserted into the box comprising the support.

FIGS. 9a, 9b, 9c and 9d represent a ¾ three-dimensional view of the various steps of the device according to the invention described in FIGS. 8a, 8b, 8c, 8d and 8e.

Under the support, a space is reserved for bringing away the strand(s) 44. Therefore this device has the advantage of saving a space usually situated behind the instrument panel.

The advantage of this second embodiment is that it reduces the sliding distance. The sliding distance being reduced, a simple, single-action slide is sufficient for this solution. Furthermore, the inclination makes it possible to prevent the inconvenience caused by tilting certain equipment situated above the LCD screen on the instrument panel.

The device according to the invention nevertheless applies more easily to small boxes having only a small number of outlets and inlets in the rear connector-module. A maximum of 100 connection points and an insertion force not exceeding 200 kilograms are recommended. A device comprising a geared handle mechanism may be combined with the device according to the invention for higher insertion forces and/or for a larger number of connections.

Another advantage of the device according to the invention is that it applies to standard connectors available off the shelf, for example connectors of the EPX type for aviation applications.

A final advantage of the device according to the invention is that it does not require high-density optoelectronic integration constraints or specific components. This device may be produced with standard off-the-shelf elements.

It will be readily seen by one of ordinary skill in the art that the present invention fulfils all of the objects set forth above. After reading the foregoing specification, one of ordinary skill in the art will be able to affect various changes, substitutions of equivalents and various aspects of the invention as broadly disclosed herein. It is therefore intended that the protection granted hereon be limited only by definition contained in the appended claims and equivalents thereof.

The invention claimed is:

1. A support comprising:

first guidance means, to guide an electronic module in a first direction of translation relative to an instrument panel, parallel to a direction of plugging a connector-module into a socket, the socket being a connector secured to the first guidance means;

said socket arranged on the first guidance means so that the connector-module plugs in the socket in the first direction of translation; and second guidance means for inserting said module into the instrument panel in a second direction of translation perpendicular to a front face of the module.

2. A support comprising:

first guidance means, in a first direction of translation relative to an instrument panel, parallel to a direction of plugging a connector-module into a socket, the first guidance means to guide the electronic module and to plug the connector-module into the socket, the socket being a connector secured to the first guidance means;

said socket arranged on the first guidance means so that the connector-module plugs in the socket in the first direction of translation;

the first guidance means adapted to allow the electronic module to pivot for inserting said electronic module into said instrument panel the pivot about an axis perpendicular to an axis of the first direction of translation and contained in a plane of a rear face of the electronic module.

3. A support comprising:

first guidance means, in a first direction of translation, parallel to the direction of plugging in, for guiding an electronic module, the socket being a connector secured to the first guidance means; wherein the electronic module is designed to be slotted into an aircraft instrument panel and includes:

a rear face and a front face that are substantially flat and parallel;

means for attaching the electronic module to the instrument panel, the means for attaching being situated on the front face of said electronic module; and at least one connector-module, attached on the rear face of said electronic module, and adapted to be plugged into a socket mounted on the panel; wherein the at least one connector-module is adapted to be plugged into the socket mounted on the panel by moving the electronic module in a direction substantially in a plane of the rear face, said socket arranged on the first guidance means so that the connector-module plugs in the socket in the first direction of translation;

the support adapted to allow the electronic module to pivot for inserting said electronic module into said instrument panel, the pivot about an axis perpendicular to an axis of translation and contained in the plane of the rear face; and the support adapted to allow the electronic module to be inserted into an instrument panel in a second direction of translation, the second direction of translation being perpendicular to a plane formed by the instrument panel.

4. The support as claimed in claim 3, wherein the first guidance means allows a vertical guidance and that the second guidance means allow a horizontal guidance.

5. The support as claimed in claim 3, wherein the socket comprises at least one optical fiber.

6. The support of claim 1, wherein said electronic module comprises:
- a rear face and a front face that are substantially flat and parallel;
- means for attaching the module to the instrument panel, the means for attaching being situated on the front face of said module; and
- the connector-module attached on the rear face of said module electronic module, and adapted to be plugged into a socket mounted on the instrument panel, wherein the direction of plugging in the connector-module is substantially in a plane of the rear face.

7. The support of claim 2, wherein said electronic module comprises:
- a rear face and a front face that are substantially flat and parallel;
- means for attaching the module to the instrument panel, the means for attaching being situated on the front face of said module; and
- the connector-module attached on the rear face of said module electronic module, and adapted to be plugged into a socket mounted on the instrument panel, wherein the direction of plugging in the connector-module is substantially in the plane of the rear face.

* * * * *